United States Patent

Aubuchon et al.

[19]

[11] Patent Number: 5,973,757
[45] Date of Patent: Oct. 26, 1999

[54] CONTOURED AND BALANCED REMOTE TV CONTROL DEVICE

[76] Inventors: Mark S. Aubuchon, 9031 Kilrenny Dr., Spring, Tex. 77379; Paul M. Pierce, 5208 N. Delaware St., Indianapolis, Ind. 46220

[21] Appl. No.: 08/828,595

[22] Filed: Mar. 31, 1997

[51] Int. Cl.[6] ........................................................ H04N 5/44

[52] U.S. Cl. .................. 348/734; D14/218; 340/825.69; 340/825.72; 341/176

[58] Field of Search ..................................... 348/734, 552; 455/151.1, 151.2, 151.4, 352, 95; D14/218; 340/825.25, 825.72; 359/142, 146; 341/176; H04N 5/44

[56] References Cited

U.S. PATENT DOCUMENTS

| | | | |
|---|---|---|---|
| D. 342,258 | 12/1993 | Saito et al. | D14/218 |
| D. 365,102 | 12/1995 | Gioscia | D14/218 |
| D. 375,748 | 11/1996 | Hartman | D14/218 |
| D. 382,272 | 8/1997 | Shiono | D14/218 |
| D. 392,641 | 3/1998 | Fenner | D14/218 |
| D. 396,469 | 7/1998 | Inami | D14/218 |
| 4,878,055 | 10/1989 | Kasahara | 348/734 |
| 5,539,478 | 7/1996 | Bertram et al. | 348/734 |
| 5,650,831 | 7/1997 | Farwell | 348/734 |

OTHER PUBLICATIONS

Mar. 21, 1996 PC Week Announcement—"New Gateway System Integrates TV with PC", Paula Rooney, p. 1 of 1.
1996 Picture of Gateway 2000 Inc. Destination Field Mouse.

*Primary Examiner*—Andrew I. Faile
*Assistant Examiner*—Reuben M. Brown
*Attorney, Agent, or Firm*—Konneker & Smith, P.C.

[57] ABSTRACT

A hand-held TV/computer remote infrared control device has an elongated rectangular housing with a front longitudinal portion and a considerably shorter rear end portion which is downwardly and rearwardly inclined relative to the front portion and has a generally bulbous underside section which may be grasped from below by a control hand of a user, with the elongated front portion extending forwardly beyond the control hand. The device is stabilized against forward tipping in the user's hand by positioning somewhat more than half of the operating weight of the device in its rear end portion. Various control buttons are disposed on the top side of the front portion, and the downward tilt of the grasped rear end portion causes the front end portion to tip upwardly to make the control buttons easier to see by the user. A computer pointing structure, in the form of a track ball and two associated selection buttons, is disposed on the top side of the rear end portion, and an auxiliary computer selection button is disposed on the bottom side of the housing at the juncture of its front portion and rear end portion. The track ball and the two top side selection buttons are positioned to be used by the user's control hand thumb, and the auxiliary selection button is positioned to be used trigger-like by the control hand index finger.

27 Claims, 3 Drawing Sheets

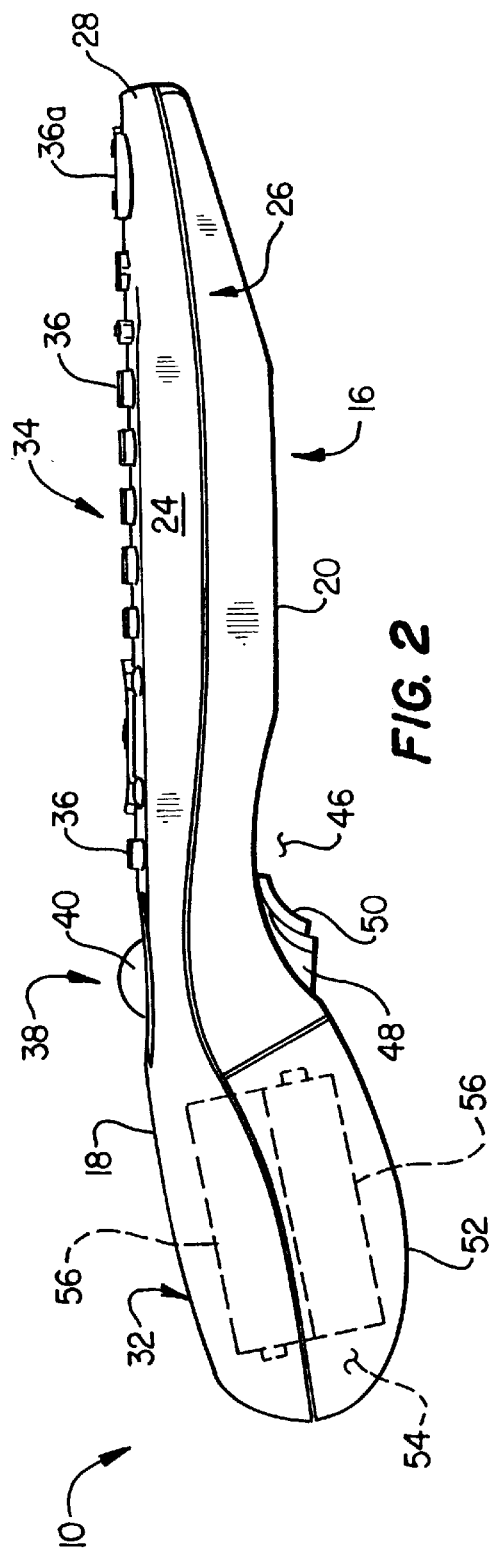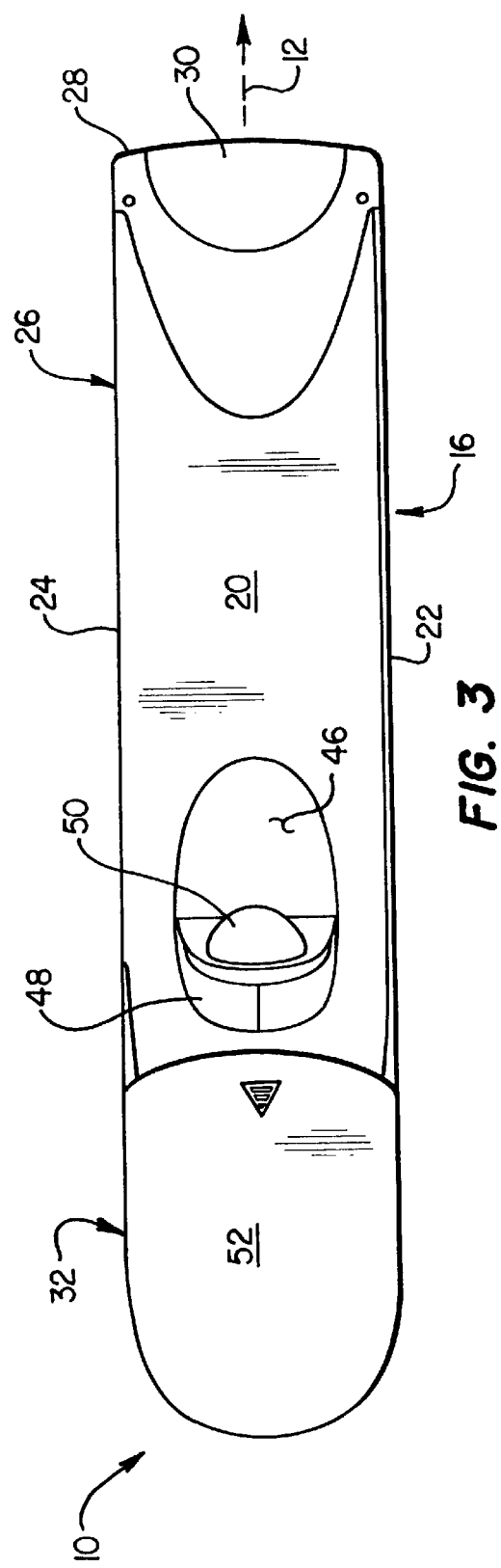

CONTOURED AND BALANCED REMOTE TV CONTROL DEVICE

BACKGROUND OF THE INVENTION

Field of the Invention

The present invention generally relates to electronic apparatus and, in a preferred embodiment thereof, more particularly relates to remote control devices for televisions and television-based computer systems.

Description of Related Art

Hand-held, battery powered infrared remote control devices have long been used to conveniently control the operation of televisions without abandoning the comfort of a couch or easy chair from which the television is being viewed. Early control devices were fairly simple, relatively compact elongated rectangular devices that could turn the TV on and off, change its channels, and adjust its volume. As home entertainment systems expanded to include with the television other equipment such as CD players, stereos, and VCR's controls for these added components were added to the formerly TV-only remote control devices with the result that they became physically larger and operationally more complex.

What typically evolved was a further elongated hand-held rectangular device with a similarly elongated multi-button keypad area on its top side. At this point, the further required elongation of the remote control device began to make it somewhat unwieldy to use. Simply stated, if the user held the device near either of its ends and momentarily relaxed his grip on the device it had a tendency to tip forwardly or rearwardly out of his hand and fall to the floor.

With the advent of television-based computer systems, in which the television is used as the monitor portion of the system, it was necessary to add computer controls, most notably computer pointing devices such as track balls and associated selection buttons, to the remote control device. The typical result has been that the control device's length must be even further increased to provide mounting space for the added computer controls. This, further elongation of the remote control device naturally tends to make it even more unstable and thus more ungainly and uncomfortable in a user's hand.

As can readily be seen from the foregoing, it would be highly desirable to provide an improved hand-held remote TV/computer control device of the general type described above, but providing increased stability and comfort in a user's hand.

SUMMARY OF THE INVENTION

In carrying out principles of the present invention, in accordance with a preferred embodiment thereof, an improved hand-held electronic remote control signal transmitting device is provided which is representatively operable to remotely control a television or a television-based computer system.

The remote control device preferably has a body in the form of an elongated housing longitudinally extending in a front-to-rear direction and having top and bottom sides, a front portion, and a rear end portion which is substantially shorter in the front-to-rear direction than the front housing portion and is preferably configured to be grasped by the upturned control hand of a user, with the front housing portion extending forwardly beyond the control hand. Representatively, the front housing portion is about twice as long and the rear housing end portion.

In its preferred television and television-based computer controlling form, the device has a series of manually operable front signal generating control members forming a key pad array disposed on the top side of the front housing portion, and computer control apparatus associated with the rear housing end portion and operable by a digit of the grasping control hand. Electronic circuitry is carried by the housing and is operative to receive input signals from the front control members and the computer control apparatus and responsively generate corresponding remotely receivable control signals, preferably infrared control signals.

Representatively, the computer control apparatus includes (1) a track ball and first and second selection buttons disposed on the top side of the housing rearwardly of the front control members and operable by the thumb of the grasping control hand, and (2) a rearwardly depressible selection button disposed on the bottom side of the housing, positioned to be operated by the index finger of the grasping control hand, and having the same function as one of the first and second selection buttons.

According to one feature of the invention, the rear housing end portion is rearwardly and downwardly inclined relative to the front housing portion, preferably at an acute angle of approximately 25 degrees. When the rear housing end portion is grasped from below by the user's upturned control hand, this downward and rearward slope of the rear housing end portion automatically causes the front housing portion to be upwardly and forwardly inclined to thereby facilitate the viewing of the front control members by the user. Preferably, the gripping of the rear housing end portion is made more comfortable by providing the rear housing end portion with a generally bulbous bottom side section configured to be complementarily received in the grasping control hand.

In accordance with another aspect of the invention, the remote control device has an operating weight at least about half of which is disposed rearwardly of the front housing portion. This rearward weight concentration functions to stabilize the device against forwardly tipping out of the control hand, is representatively facilitated by placing within the rear housing end portion the batteries that power the electronic circuitry, and also functions to free the user's control hand thumb to operate the track ball and upper side selection buttons, and free the user's control hand index finger to operate the bottom side selection button.

BRIEF DESCRIPTION OF THE DRAWINGS

FIG. 2 is a reduced scale right side elevational view of the device;

FIG. 3 is a reduced scale bottom plan view of the device;

DETAILED DESCRIPTION

Figure 1:
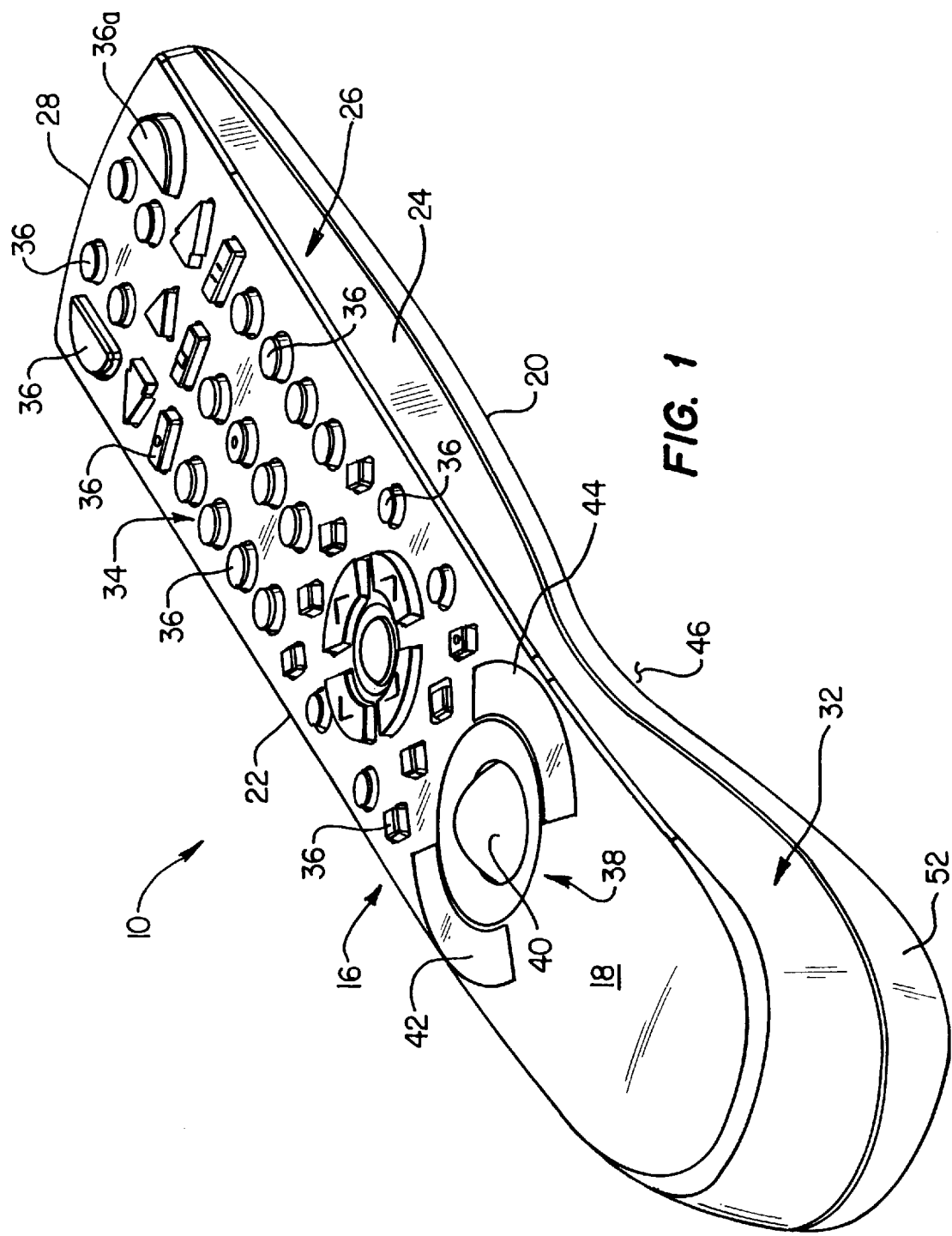
FIG. 1 is a right rear perspective view of an improved remote TV control device embodying principles of the present invention.
Figure 4:
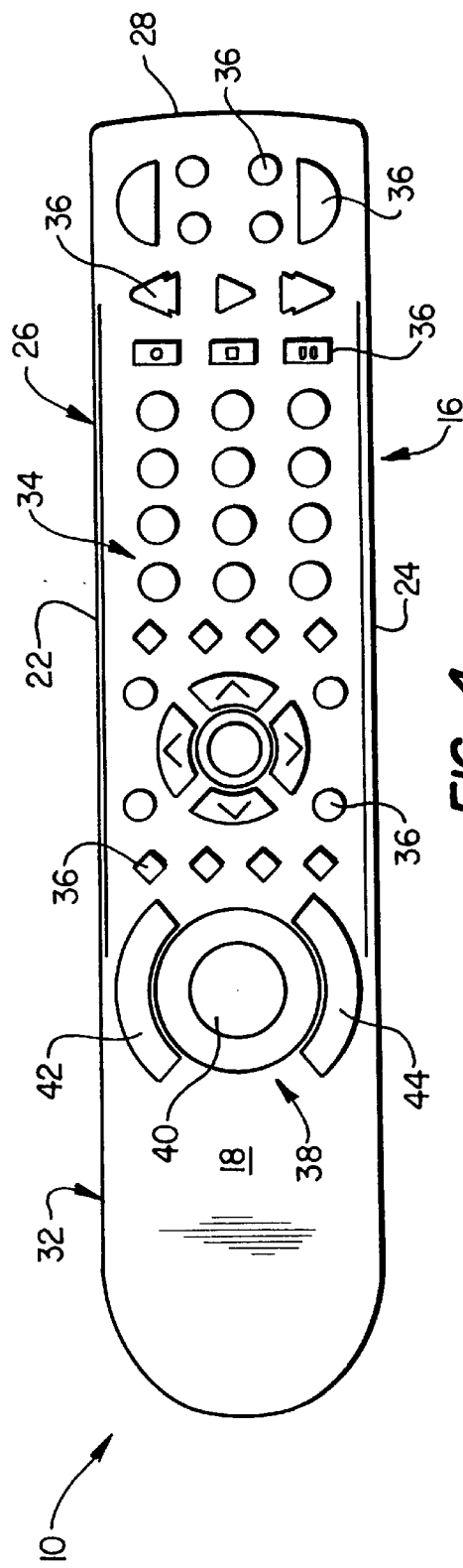
FIG. 4 is a reduced scale top plan view of the device.
Figure 5:
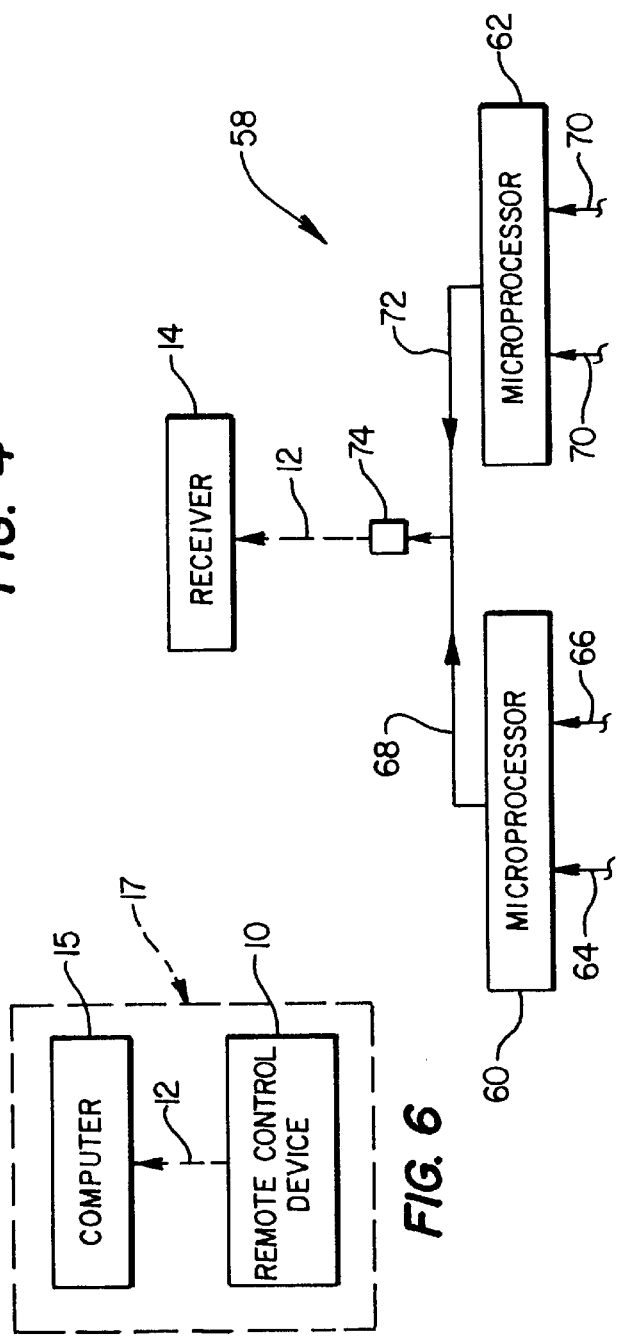
FIG. 5 is a highly schematic diagram of a portion of the electronic circuitry in the device.
Figure 6:
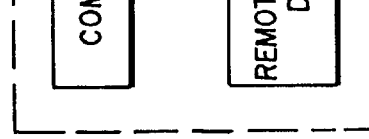
FIG. 6 is a highly schematic block diagram of a TV-based computer system incorporating the remote control device.

Illustrated in FIGS. 1–4 is an improved hand-held TV/computer remote control device 10 which embodies principles of the present invention and may be utilized to transmit an infrared control signal 12 (see FIG. 5) to a receiver portion 14 of a television or the computer portion 15 of a television-based computer system 17 as schematically depicted in FIG. 6. The remote control device 10 includes a body portion in the form of a plastic housing 16 in which the later described battery-powered electronic circuitry of the device is operatively disposed.

Housing 16 has top and bottom sides 18 and 20; opposite left and right sides 22 and 24; an elongated rectangular front portion 26 having a front or outer end 28 which operatively supports a lens structure 30 (see FIG. 3); and a downwardly bent rear end portion 32 having a generally bulbous bottom side configuration. The front housing portion 26 is substantially longer in a front-to-rear direction than the rear housing portion 32—representatively about twice as long as the rear housing portion.

Operatively disposed on the top side 18 of the front housing portion 26 is a similarly elongated rectangular key pad array 34 of manually depressible control buttons 36 useable to control the operation of a television and associated peripheral devices such as a VCR, and a computer (in, for example, a television-based computer system). One of the buttons 36, button 36a (see FIG. 1) is operative to selectively switch the device 10 between a TV control mode and a computer control mode.

Mounted on the top side 18 of the rear housing portion 32, adjacent its juncture with the front housing portion 26, is a computer pointing device structure 38 that representatively includes a track ball 40 flanked by left and right manually depressible selection buttons 42,44 corresponding in operation and function to the left and right click buttons on a computer mouse. When the remote control device 10 is switched to its computer mode, the track ball 40 may be appropriately rotated to move a TV screen cursor to a desired computer operation displayed thereon, and the buttons 42,44 may be used to select and otherwise control the cursor-indicated operation in a known manner.

Turning now to FIGS. 2 and 3, an upwardly indented area 46 is formed in the bottom side of the housing 16 generally adjacent the juncture of the front and rear portions 26,32 thereof. A mounting structure 48 projects forwardly from a rear end surface portion of the indented area 46 and operatively supports a selection button 50 which may be manually depressed in a generally rearward direction. Button 50 performs the same function as one of the two upper side selection buttons 42 and 44, representatively the left button 42.

Immediately to the rear of the mounting structure 48 on the bottom side of the housing 16 is a removable housing wall portion 52 that covers a rear housing end well area 54 representatively configured to receive four "AA" dry cell batteries 56, only two of which are visible in FIG. 2. Batteries 56 power the electronic circuitry within the housing 16, a portion 58 of such circuitry being depicted in highly schematic form in FIG. 5.

Electronic circuitry 58 includes a first preprogrammed microprocessor 60 and a second preprogrammed microprocessor 62. Microprocessor 60 is operative to receive input signals 64,66 respectively from the track ball 40 and the selection buttons 42,44 and 50 and responsively output an appropriate infrared protocol signal 68. Microprocessor 62 is operative to receive input signals 70 (only two of which are representatively shown) from the buttons 36 on the top side of the front housing portion 26 and responsively output an appropriate infrared protocol signal 72. Infrared protocol signals 68 and 72 are transmitted to a light emitting diode (LED) 74 which responsively transmits the corresponding infrared signal 12 through the lens structure 30 (see FIG. 3) to the receiver 14.

Compared to conventional hand-held remote TV/computer control devices, the device 10 of the present invention provides during its use substantially enhanced levels of comfort, stability and ease of operation due to its unique configurational and balance characteristics as will now be described.

To operate the device 10 the user simply places his upturned control hand beneath and grasps the rear housing end portion 32 with the front housing portion 26 extending in a cantilevered fashion forwardly beyond his control hand. The generally bulbous underside section of the rear housing end portion 32 is contoured to be conformingly and quite comfortably received in the cupped control hand of the user so that he is holding the device 10 in a generally gun-like manner and can easily point the front housing end 38 at the receiver 14.

The grasping of the rear housing end portion 32 in this manner automatically places the user's control hand thumb generally above the pointing device structure 38 where it can easily reach and operate the track ball 40 and the left and right selection buttons 42 and 44. It also automatically places the user's control hand index finger just forwardly of the bottom side selection button 50 so that the user can depress button 50 simply by rearwardly squeezing it in a gun trigger-like manner. As will be recalled, the bottom side selection button 50 performs the same function as the left top side selection button 42. Accordingly, the user can roll the track ball 40 with his control hand thumb, and then execute the left button "select" function by either (1) downwardly depressing the left top side button 42 with his control hand thumb, or (2) rearwardly depressing the bottom side button 50 with his control hand index finger.

When the user operatively grasps the downwardly bent rear housing end portion 32 as just described, approximately two-thirds of the overall front-to-rear length of the device 10 projects forwardly beyond the user's control hand. Despite this major forward overhang, the device is uniquely balanced in such a manner that even if the user opens his control hand, thereby relaxing his grip on the device 10, there is little if any tendency for the substantially cantilevered device 10 to tip forwardly out of the user's opened hand—it just sits there in a relatively stable position.

This enhanced and quite desirable stability is achieved by configuring the device 10 in a manner such that the front-to-rear position of its center of gravity is generally at or somewhat behind the center of the track ball 40 (which is generally adjacent the juncture of the front and rear housing portions 26,32). This positioning of the device center of gravity results in somewhat more than half of the total operational weight of the device (i.e., the weight of the device with the batteries 56 installed therein) being concentrated in the rear housing end portion 32, and is facilitated by the placement of the batteries 56 in such rear end portion of the housing 16. Because of the high degree of stability provided by this rearwardly skewed weight distribution, the user's control hand thumb and index finger are not needed to stabilize the device in the user's hand—they are instead freed to operate the track ball 40 and the selection buttons 42,44 and 50.

As previously mentioned, the somewhat bulbous rear housing end portion 32 is downwardly bent relative to the essentially straight and considerably longer front housing portion 26. More specifically, the rear housing end portion 32 is downwardly and rearwardly sloped relative to the front housing portion 26 at an angle of approximately 25 degrees. The benefit of this downward and rearward tilting of the rear housing end portion 32 is that when it is operatively grasped by a user of the device 10 the front housing portion 26 is automatically sloped upwardly and forwardly at a generally similar angle. This resulting upward and forward inclination of the front housing portion 26 makes it substantially easier for the user to see the top side buttons 36 compared to the essentially horizontal operating orientation of such buttons in a conventionally configured remote TV control device.

The foregoing detailed description is to be clearly understood as being given by way of illustration and example only, the spirit and scope of the present invention being limited solely by the appended claims.

What is claimed is:

1. A hand-held electronic remote control signal transmitting device comprising:

an elongated body longitudinally extending in a front-to-rear direction and having top and bottom sides, a front portion, and a rear end portion substantially shorter than said front portion in said front-to-rear direction and being configured to be grasped from below by a control hand of a user, with said front portion extending forwardly beyond the control hand, said rear end portion of said body, including the top side thereof, being downwardly and rearwardly inclined relative to said front portion of said body;

said device having an operating weight, at least about half of which is disposed rearwardly of said front portion to thereby stabilize said device against forwardly tipping out of the control hand;

a key pad structure carried on said top side of said front portion of said body; and a signal generating position control member carried on said top side of said rear end portion of said body and positioned to be operated by a digit of the grasping control hand.

2. The device of claim 1 wherein said device is operable to remotely control a television.

3. The device of claim 1 wherein said device is operable to remotely control a television-based computer system.

4. The device of claim 1 wherein said rear end portion of said body is about half as long in said front-to-rear direction as said front portion of said body.

5. The device of claim 1 wherein said signal generating position control member is a computer pointing device carried on said top side of said body and operable by the thumb of the grasping control hand.

6. The device of claim 5 wherein said computer pointing device is a track ball.

7. The device of claim 5 further comprising a computer pointing device selection button carried on said bottom side of said body and operable by the index finger of the grasping control hand.

8. The device of claim 1 wherein said rear end portion of said body has a generally bulbous underside section.

9. A hand-held remote control device comprising:

an elongated housing longitudinally extending in a front-to-rear direction and having top and bottom sides, a front portion, and a rear end portion substantially shorter than said front portion and being configured to be operatively grasped from below by an upturned control hand of a user, with said front portion of said housing extending forwardly beyond the control hand, said device having an operating weight at least about half of which is disposed rearwardly of said front portion of said housing to thereby inhibit forward tipping of said device out of the control hand;

a key pad array carried on the top side of said front portion of said housing, said rear end portion of said housing, including the top side thereof, being downwardly and rearwardly inclined relative to said front portion of said housing in a manner causing the top side of said front portion of said housing to be upwardly and forwardly inclined, when said rear end portion of said housing is operatively grasped by the control hand, to thereby facilitate user viewing of said key pad array;

computer control apparatus associated with said rear end portion of said housing and operable by a digit of the grasping control hand; and electronic circuitry carried by said housing and operative to receive input signals from said front control members and said computer control apparatus and responsively generate corresponding remotely receivable control signals.

10. The remote control device of claim 9 wherein said device is operable to remotely control a television.

11. The remote control device of claim 9 wherein said device is operable to remotely control a television-based computer system.

12. The remote control device of claim 9 wherein said rear end portion of said housing is inclined at an acute angle relative to said front portion of said housing.

13. The remote control device of claim 12 wherein said acute angle is approximately 25 degrees.

14. The remote control device of claim 9 wherein said rear end portion of said housing has a generally bulbous bottom side section configured to be complementarily received in the grasping control hand.

15. The remote control device of claim 9 wherein said rear end portion of said housing is about half as long in said front-to-rear direction as said front portion of said housing.

16. The remote control device of claim 9 wherein said computer control apparatus includes a pointing device and at least one associated selection button disposed on said top side of said housing behind said key pad array and operable by the thumb of the grasping control hand.

17. The remote control device of claim 16 wherein said at least one associated selection button includes first and second selection button each having a different function.

18. The remote control device of claim 17 wherein said computer apparatus further comprises a third selection button disposed on said bottom side of said housing and operable by the index finger of the grasping control hand.

19. The remote control device of claim 18 wherein said third selection button is rearwardly depressible by the index finger of the grasping control hand.

20. The remote control device of claim 18 wherein said third selection button has the same function as one of said first and second selection buttons.

21. The remote control device of claim 9 wherein said computer control apparatus includes a selection button disposed on said bottom side of said housing and operable by the index finger of the grasping control hand.

22. The remote control device of claim 21 wherein said selection button is rearwardly depressible by the index finger of the grasping control hand.

23. The remote control device of claim 9 wherein said remotely receivable control signals are infrared control signals.

24. The remote control device of claim 23 wherein said electronic circuitry includes:

microprocessor means for receiving said input signals from said front control members and said computer control apparatus and responsively generating infrared protocol signals, and LED means for receiving said infrared protocol signals and responsively generating said infrared control signals.

25. The remote control device of claim 9 wherein:

said electronic circuitry is battery-powered, and said remote control device further includes a battery holding area disposed within the interior of said rear end portion of said housing and adapted to hold at least one battery operative to power said electronic circuitry.

26. A computer system including a hand-held electronic remote control signal transmitting device for controlling the system, said device comprising:

an elongated body longitudinally extending in a front-to-rear direction and having top and bottom sides, a front portion, and a rear end portion substantially shorter than said front portion in said front-to-rear direction and being configured to be grasped from below by a control hand of a user, with said front portion extending forwardly beyond the control hand, said rear end portion of said body, including the top side thereof, being downwardly and rearwardly inclined relative to said front portion of said body, said device having an operating weight, at least about half of which is disposed rearwardly of said front portion to thereby stabilize said device against forwardly tipping out of the control hand;

a key pad structure carried on said top side of said front portion of said body; and a signal generating position control member carried on said top side of said rear end portion of said body and positioned to be operated by a digit of the grasping control hand.

27. A computer system including a hand-held remote control device for controlling the system, said device comprising:

an elongated housing longitudinally extending in a front-to-rear direction and having top and bottom sides, a front portion, and a rear end portion substantially shorter than said front portion and being configured to be operatively grasped from below by an upturned control hand of a user, with said front portion of said housing extending forwardly beyond the control hand, said device having an operating weight at least about half of which is disposed rearwardly of said front portion of said housing, including on the top side thereof to thereby inhibit forward tipping of said device out of the control hand;

a series of manually operable front control members carried on the top side of said front portion of said housing, said rear end portion of said housing being downwardly and rearwardly inclined relative to said front portion of said housing in a manner causing the top side of said front portion of said housing to be upwardly and forwardly inclined, when said rear end portion of said housing is operatively grasped by the control hand, to thereby facilitate user viewing of said front control members;

computer control apparatus associated with said rear end portion of said housing and operable by a digit of the grasping control hand; and electronic circuitry carried by said housing and operative to receive input signals from said front control members and said computer control apparatus and responsively generate corresponding remotely receivable control signals.

* * * * *